United States Patent
Zou et al.

(10) Patent No.: US 11,205,677 B2
(45) Date of Patent: Dec. 21, 2021

(54) MICRO-LED DEVICE, DISPLAY APPARATUS AND METHOD FOR MANUFACTURING A MICRO-LED DEVICE

(71) Applicant: Goertek, Inc., Weifang (CN)

(72) Inventors: Quanbo Zou, Weifang (CN); Peixuan Chen, Weifang (CN); Xiangxu Feng, Weifang (CN)

(73) Assignee: Goertek, Inc., Weifang (CN)

( * ) Notice: Subject to any disclaimer, the term of this patent is extended or adjusted under 35 U.S.C. 154(b) by 0 days.

(21) Appl. No.: 16/473,538

(22) PCT Filed: Jan. 24, 2017

(86) PCT No.: PCT/CN2017/072483
§ 371 (c)(1),
(2) Date: Jun. 25, 2019

(87) PCT Pub. No.: WO2018/137139
PCT Pub. Date: Aug. 2, 2018

(65) Prior Publication Data
US 2020/0152693 A1    May 14, 2020

(51) Int. Cl.
| | |
|---|---|
| *H01L 27/15* | (2006.01) |
| *H01L 25/18* | (2006.01) |
| *H01L 33/38* | (2010.01) |
| *H01L 33/46* | (2010.01) |
| *H01L 33/62* | (2010.01) |

(52) U.S. Cl.
CPC .......... *H01L 27/153* (2013.01); *H01L 25/18* (2013.01); *H01L 33/385* (2013.01); *H01L 33/46* (2013.01); *H01L 33/62* (2013.01)

(58) Field of Classification Search
CPC .................................................... H01L 33/385
See application file for complete search history.

(56) References Cited

U.S. PATENT DOCUMENTS

| | | | |
|---|---|---|---|
| 6,410,940 B1* | 6/2002 | Jiang | B82Y 20/00 257/79 |
| 7,210,819 B2* | 5/2007 | Jiang | H05B 45/37 362/249.02 |
| 7,213,942 B2* | 5/2007 | Jiang | H01L 24/82 362/231 |
| 7,221,044 B2* | 5/2007 | Fan | H01L 27/153 257/676 |

(Continued)

FOREIGN PATENT DOCUMENTS

| | | |
|---|---|---|
| CN | 102479914 A | 3/2012 |
| CN | 102479797 A | 5/2012 |
| CN | 105336827 | 2/2016 |

OTHER PUBLICATIONS

International Preliminary Report on Patentability, PCT App. No. PCT/CN2017/072483, WIPO, dated Jul. 30, 2019, all pages. (Year: 2019).*

*Primary Examiner* — Victoria K. Hall
(74) *Attorney, Agent, or Firm* — Baker Botts, LLP

(57) ABSTRACT

A micro-LED device, a display apparatus and a method for manufacturing a micro-LED device are provided. The micro-LED device comprises: a growth substrate; a plurality of vertical micro-LEDs formed on the growth substrate; a first type electrode formed on top of each of the vertical micro-LEDs; and a second type electrode formed on side surface of each of the vertical micro-LEDs.

11 Claims, 3 Drawing Sheets

(56) References Cited

U.S. PATENT DOCUMENTS

| | | | |
|---|---|---|---|
| 7,525,248 B1* | 4/2009 | Fan | H01L 25/0753 313/498 |
| 7,535,028 B2* | 5/2009 | Fan | H01L 27/153 257/88 |
| 7,714,348 B2* | 5/2010 | Fan | H05B 45/00 257/99 |
| 10,128,308 B1* | 11/2018 | Shin | H01L 25/18 |
| 10,193,012 B2* | 1/2019 | Zou | H01L 25/0753 |
| 10,756,069 B2* | 8/2020 | Zou | H01L 33/0093 |
| 11,061,276 B2* | 7/2021 | Cok | G09F 9/33 |
| 11,063,172 B2* | 7/2021 | Pares | H01L 27/1462 |
| 2006/0091786 A1* | 5/2006 | Chakraborty | H01L 33/08 313/500 |
| 2006/0163589 A1* | 7/2006 | Fan | H01L 27/153 257/88 |
| 2006/0169994 A1* | 8/2006 | Tu | H01L 33/36 257/89 |
| 2006/0231852 A1* | 10/2006 | Kususe | H01L 33/385 257/99 |
| 2007/0120141 A1* | 5/2007 | Moustakas | H01L 31/1852 257/103 |
| 2008/0083929 A1* | 4/2008 | Fan | H05B 45/00 257/79 |
| 2008/0211416 A1* | 9/2008 | Negley | H01L 33/32 315/193 |
| 2012/0001223 A1* | 1/2012 | Inoue | H01L 33/14 257/103 |
| 2012/0248464 A1* | 10/2012 | Jumonji | H01L 33/44 257/79 |
| 2012/0267655 A1* | 10/2012 | Zhang | H01L 33/04 257/94 |
| 2013/0187124 A1* | 7/2013 | Zhang | B82Y 20/00 257/13 |
| 2013/0248904 A1* | 9/2013 | Sugizaki | H01L 33/385 257/98 |
| 2013/0328493 A1* | 12/2013 | Munday | H05B 45/37 315/201 |
| 2014/0001510 A1* | 1/2014 | Wu | H01L 33/38 257/99 |
| 2014/0048824 A1* | 2/2014 | Hsieh | H01L 33/507 257/88 |
| 2014/0117395 A1* | 5/2014 | Kim | H01L 33/22 257/98 |
| 2014/0138615 A1* | 5/2014 | Shen | H01L 33/385 257/13 |
| 2014/0159071 A1* | 6/2014 | Choi | H01L 33/10 257/88 |
| 2014/0232759 A1* | 8/2014 | Simmonds | G09G 3/00 345/690 |
| 2015/0380459 A1* | 12/2015 | Bono | H01L 27/156 257/13 |
| 2016/0099383 A1* | 4/2016 | Yuh | H01L 33/0095 257/99 |
| 2016/0218143 A1* | 7/2016 | Chaji | H01L 24/96 |
| 2016/0343900 A1* | 11/2016 | Obuchi | H01L 33/32 |
| 2017/0104139 A1* | 4/2017 | Seo | H01L 33/46 |
| 2017/0133818 A1* | 5/2017 | Cok | G02B 3/0006 |
| 2017/0141154 A1* | 5/2017 | Cha | H01L 27/156 |
| 2017/0142874 A1* | 5/2017 | Pourchet | H01L 21/6836 |
| 2017/0170152 A1* | 6/2017 | Wi | H01L 24/95 |
| 2017/0179097 A1* | 6/2017 | Zhang | H01L 27/156 |
| 2017/0187976 A1* | 6/2017 | Cok | G09G 3/3611 |
| 2017/0338380 A1* | 11/2017 | Lee | H01L 33/46 |
| 2017/0338389 A1* | 11/2017 | Zhan | H01L 33/62 |
| 2018/0019233 A1* | 1/2018 | Chang | H01L 25/167 |
| 2018/0090539 A1* | 3/2018 | Son | H01L 33/20 |
| 2018/0212111 A1* | 7/2018 | Yim | H01L 33/502 |
| 2018/0233536 A1* | 8/2018 | Chang | H01L 33/56 |
| 2018/0277524 A1* | 9/2018 | Moon | H01L 33/22 |
| 2018/0277719 A1* | 9/2018 | Lee | H01L 33/46 |
| 2018/0315738 A1* | 11/2018 | Bono | H01L 25/0753 |
| 2018/0331085 A1* | 11/2018 | Chang | H01L 33/36 |
| 2019/0019782 A1* | 1/2019 | Park | H01L 27/156 |
| 2019/0027075 A1* | 1/2019 | Hughes | G09G 3/006 |
| 2019/0334060 A1* | 10/2019 | Zou | H01L 33/14 |
| 2019/0355786 A1* | 11/2019 | Iguchi | H01S 5/0425 |
| 2020/0083197 A1* | 3/2020 | Zou | H01L 22/22 |
| 2021/0126157 A1* | 4/2021 | Dupre | H01L 31/1848 |

* cited by examiner

MICRO-LED DEVICE, DISPLAY APPARATUS AND METHOD FOR MANUFACTURING A MICRO-LED DEVICE

CROSS-REFERENCE TO RELATED APPLICATIONS

This application is a National Stage of International Application No. PCT/CN2017/072483 filed on Jan. 24, 2017 which is hereby incorporated by reference in its entirety.

FIELD OF THE INVENTION

The present invention relates to the technical field of micro-LED, and more specifically, to a micro-LED device, a display apparatus and a method for manufacturing a micro-LED device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep influence on the conventional display products such as LCD/OLED that have already been put into the market.

Generally, a micro-LED is formed on a growth substrate through epitaxy growth. In the prior art, there are two kinds of structure for a micro-LED. The first one is a lateral structure and the second one is a vertical structure.

FIG. 1 shows a plurality of micro-LEDs with a lateral structure (or lateral micro-LEDs) formed on a growth substrate 11. As shown in FIG. 1, a lateral micro-LED includes an un-doped epitaxy layer 12, a N-type doped layer 17 which includes a N-type heavily doped sub-layer (shown in dark), a multiple quantum well layer 14 and a P-type doped layer 16. A N-metal electrode 13 and a P-metal electrode 15 are formed on top of the N-type heavily doped layer and the P-type doped layer 16, respectively.

FIG. 2 shows a plurality of micro-LEDs with a vertical structure (or vertical micro-LEDs) formed on a growth substrate 21. As shown in FIG. 2, a vertical micro-LED includes, in sequence from the growth substrate 21, an un-doped epitaxy layer 22, a N-type doped layer 27 which includes a N-type heavily doped sub-layer (shown in dark), a multiple quantum well layer 24 and a P-type doped layer 26. A P-metal electrode 25 is formed on top of the P-type doped layer 26.

Compared with a vertical micro-LED, a lateral micro-LED has a relatively larger size and thus the resolution may be lowered. In addition, the manufacturing of a lateral micro-LED requires at least two steps of epitaxy etching to form a mesa and a trench, and thus the fabrication may be complicated.

Typically, only P-metal electrode (or a pad or a contact) may be formed on a vertical micro-LED structure on a growth substrate. The vertical micro-LED shall be transferred to a receiving substrate, and then the N-side thereof shall be thinned and/or etched to make a N-metal electrode. The fabrication process for a vertical micro-LED may be complicated, and thus a yield/cost issue may b-arise.

Therefore, there is a demand in the art that a new solution for a micro-LED device shall be proposed to address at least one of the problems in the prior art.

SUMMARY OF THE INVENTION

One object of this invention is to provide a new technical solution for a micro-LED device.

According to a first aspect of the present invention, there is provided a micro-LED device, comprising: a growth substrate; a plurality of vertical micro-LEDs formed on the growth substrate; a first type electrode formed on top of each of the vertical micro-LEDs; and a second type electrode formed on side surface of each of the vertical micro-LEDs.

Alternatively or optionally, the vertical micro-LEDs include at least one of green and blue vertical micro-LEDs, the growth substrate is a sapphire substrate, and the vertical micro-LEDs output light via the growth substrate.

Alternatively or optionally, each of the vertical micro-LEDs with vertical structure includes, in sequence above the growth substrate, a second type doped region, a multiple quantum well layer and a first type doped region, the second type doped region includes a second type heavily doped region, and the second type electrode covers a side surface of the second type heavily doped region.

Alternatively or optionally, the first type electrode is a P-type electrode, the second type electrode is a N-type electrode, the first type doped region is a P-type doped region and the second type doped region is a N-type doped region.

Alternatively or optionally, a dielectric layer is formed on surface of the vertical micro-LEDs, and the dielectric layer is a Distributed Bragg Reflector.

Alternatively or optionally, the second type electrode is a conductive layer lower than the multiple quantum well layer, and at least one of a dielectric layer or a planarization layer is formed on the conductive layer.

Alternatively or optionally, a control circuitry is formed above the vertical micro-LEDs. or the vertical micro-LEDs is bonded to an integrated circuit driver via a conductive bond layer.

According to a second aspect of the present invention, there is provided a display apparatus, including at least one micro-LED device according to an embodiment.

Alternatively or optionally, it includes a red micro-LED device with red micro-LEDs, a green micro-LED device with green micro-LEDs and a blue micro-LED device with blue micro-LEDs as light sub-sources, and light from the red, green and blue micro-LED devices are combined through an optical system; and wherein at least one of the green micro-LED device and the blue micro-LED device is the micro-LED device according to an embodiment.

According to a third aspect of the present invention, there is provided a method for manufacturing a micro-LED device, comprising: forming a plurality of vertical micro-LEDs on a growth substrate; forming a first type electrode on top of each micro-LED; and forming a second type electrode on side surface of each of the vertical micro-LEDs.

According to an embodiment of this invention, a finished device can be formed on a growth substrate. The fabrication thereof may be simplified.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
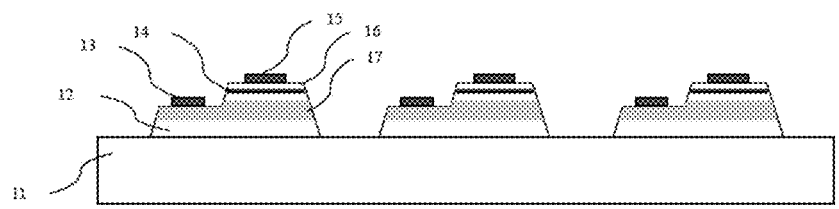
FIG. 1 is a schematic diagram of a plurality of prior art lateral micro-LEDs on a growth substrate.
Figure 2:
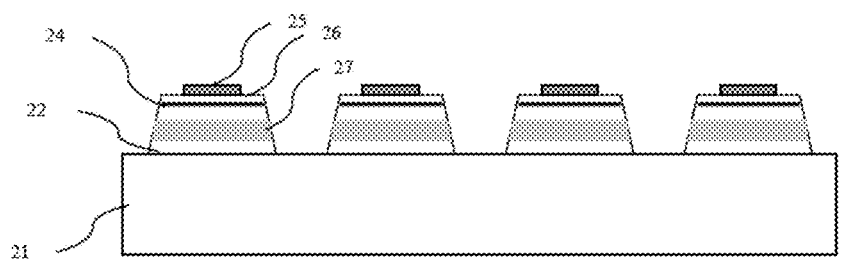
FIG. 2 is a schematic diagram of a plurality of prior art vertical micro-LEDs on a growth substrate.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples will be described below with reference to the drawings.

Figure 3:
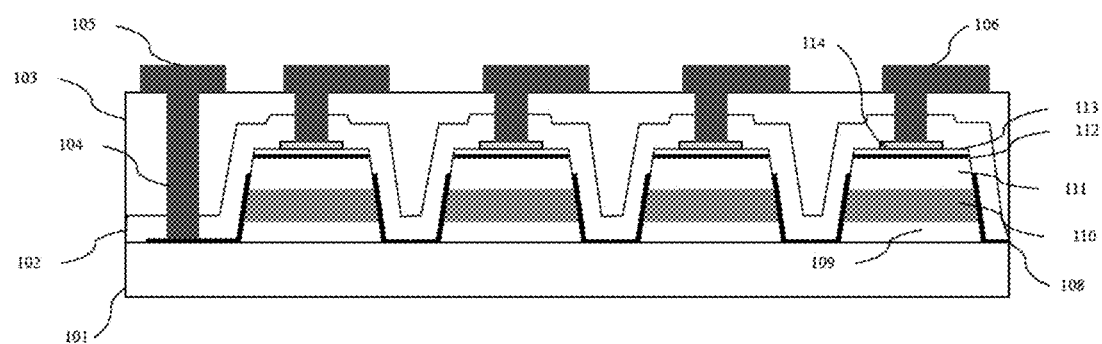
FIG. 3 is schematic diagram of a micro-LED device with a plurality of vertical micro-LEDs on a growth substrate according to an embodiment of the present invention.

FIG. 3 is schematic diagram of a micro-LED device with a plurality of vertical micro-LEDs on a growth substrate according to an embodiment of the present invention. For example, the micro-LED device is a micro-LED display device.

As shown, in FIG. 3, the micro-LED device comprises: a growth substrate 101; a plurality of vertical micro-LEDs formed on the growth substrate 101; a first type electrode 114 formed on top of each of the vertical micro-LEDs; and a second type electrode 108 formed on side surface (or peripheral) of each of the vertical micro-LEDs.

The micro-LED device can be a light source for a display apparatus or for other devices which use such a light source.

In this embodiment, the micro-LEDs are made on a growth substrate to form a finished device. In this manner, a transfer to another receiving substrate may be omitted and thus the fabrication may be simplified. In addition, the influence of the transfer onto the micro-LEDs may be reduced. Furthermore, the micro-LEDs are vertical micro-LEDs and the size thereof can be reduced. For example, the definition of the device can be improved.

Optionally, since the second type electrode is formed on side surface of a vertical micro-LED, this electrode can be used for thermal dispersion of the micro-LED. Accordingly, the thermal performance of such a device may be improved.

In an example, the vertical micro-LEDs are at least one of green and blue vertical micro-LEDs. The growth substrate 101 is a sapphire substrate. In this regard, the vertical micro-LEDs can output light via the growth substrate 101.

Compared with a prior art vertical micro-LED, no electrode is not formed on light emitting size of the micro-LED in FIG. 3, and the light can directly go through the sapphire substrate. The light emitting efficiency may be improved.

The other components of the vertical micro-LEDs can be the same as used in the prior art. For example, as shown in FIG. 3, each of the vertical micro-LEDs includes, in sequence above the growth substrate, an un-doped epitaxy layer 109, a second type doped region 111, a multiple quantum well layer 112 and a first type doped region 113. The second type doped region III may include a second type heavily doped region 110. It shall be understood by a person skilled in the art that, the first type electrode 114 may formed on top of the first type doped region 113. A dielectric layer 102 may be formed surface of the vertical micro-LEDs, for electric insulation. A planarization layer 103 may be formed for planarization of the device. Pads 106, 105 may be formed on the planarization layer 103 and be connected with the first and second type electrodes 114, 108, respectively, through vertical interconnection vias 104. It shall be appreciated by a person skilled in the art that the dielectric layer 102 and the planarization layer 103 may be merged in some examples.

It shall be understood by a person skilled in the art that, the second type electrode will be in contact with second type heavily doped region 110, and thus it may covers a side surface of the second type heavily doped region. It shall be also understood by a person skilled in the art that, the second type electrode is lower than the multiple quantum well layer 112, since the first type electrode is connected with the first type doped region.

For example, the first type electrode 114 is a P-type electrode (or P-metal), the second type electrode 108 is a N-type electrode, the first type doped region 113 is a P-type doped region and the second type doped region 111 is a N-type doped region.

In an example, the dielectric layer 102 may be a Distributed Bragg Reflector (DBR). In this manner, the light produced by a vertical micro-LED may be prevented from emitting to other directions except the direction the growth substrate 101. Accordingly, the light emitting efficiency may be improved.

Figure 4:
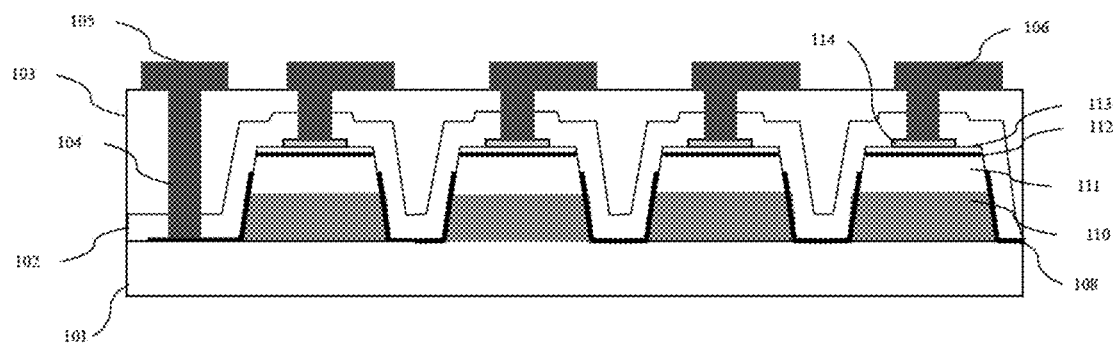
FIG. 4 is schematic diagram of a micro-LED device with a plurality of vertical micro-LEDs on a growth substrate according to another embodiment of the present invention.

FIG. 4 shows schematic diagram of a micro-LED device with a plurality of vertical micro-LEDs on a growth substrate according to another embodiment of the present invention.

The difference between FIG. 4 and FIG. 3 lies in that the second type doped region 111 is directly formed on the growth substrate 101, without a un-doped epitaxy layer 109. The other components of FIG. 4 are the same as those of FIG. 3 and thus are omitted.

Figure 5:
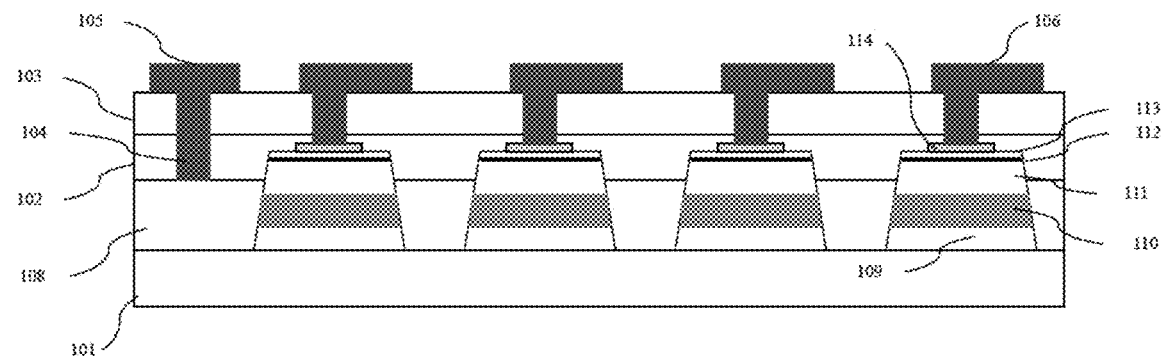
FIG. 5 is schematic diagram of a micro-LED device with a plurality of vertical micro-LEDs on a growth substrate according to another embodiment of the present invention.

FIG. 5 is schematic diagram of a micro-LED device with a plurality of vertical micro-LEDs on a growth substrate according to another embodiment of the present invention.

In FIG. 5, the second type electrode 108 is a conductive layer lower than the multiple quantum well layer 112. In this embodiment, the second type electrode 108 is not a coating on the peripheral of a vertical micro-LED, and is a layer deposited between the vertical micro-LEDs. At least one of a dielectric layer 102 or a planarization layer 103 is formed on the conductive layer 108. The other components of FIG. 5 are the same as those of FIG. 3 or 4 and thus are omitted.

In this embodiment, a conductive layer 108 is used as a common electrode. This may improve the thermal dispersion of the device. Furthermore, the fabrication for the device may further be simplified.

Figure 6:
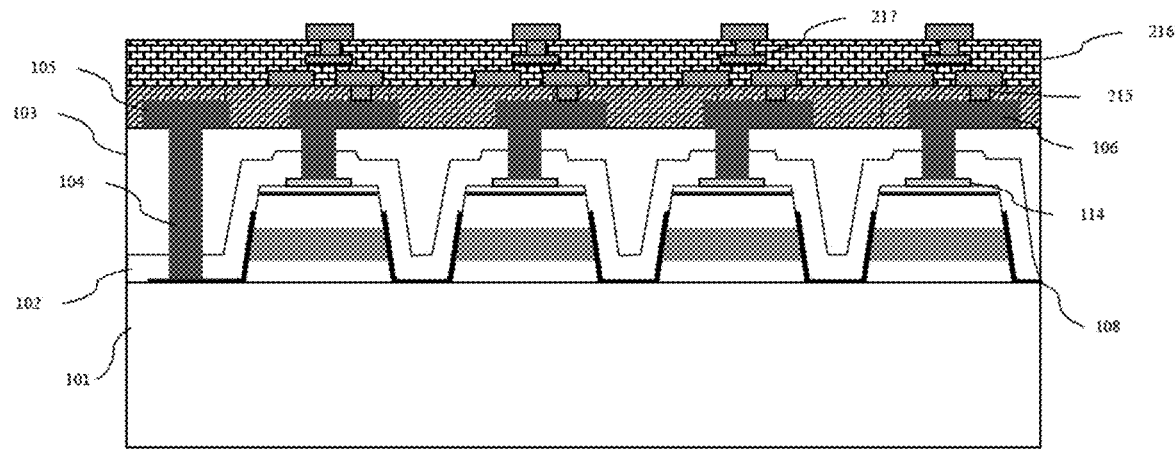
FIG. 6 is schematic diagram of a micro-LED device with a plurality of vertical micro-LEDs on a growth substrate according to another embodiment of the present invention.

FIG. 6 is schematic diagram of a micro-LED device with a plurality of vertical micro-LEDs on a growth substrate according to another embodiment of the present invention.

In FIG. 6, a control circuitry 216 is formed above the vertical micro-LEDs. The control circuitry 216 may be connected with the pads 105, 106 via a bonding layer 215. The control circuitry 216 may include thin film transistors (TFTs) 217.

The other components of FIG. 6 may be the same as those of FIG. 3, 4 or 5 and thus are omitted.

Figure 7:
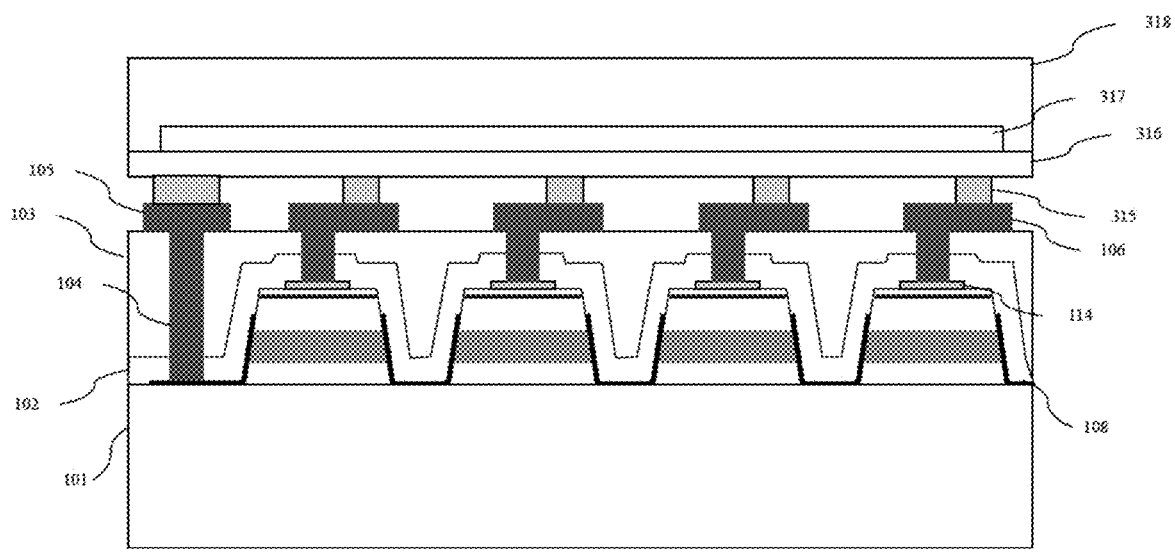
FIG. 7 is schematic diagram of a micro-LED device with a plurality of vertical micro-LEDs on a growth substrate according to another embodiment of the present invention.

FIG. 7 is schematic diagram of a micro-LED device with a plurality of vertical micro-LEDs on a growth substrate according to another embodiment of the present invention.

In FIG. 7, the vertical micro-LEDs are bonded to an integrated circuit (IC) driver 317 via a conductive bond layer 315. For example, the conductive bond layer 315 connects the pads 105, 106 to a dielectric layer 316 with interconnections. The IC driver 317 is mounted on the dielectric layer 316 with interconnections. For example, the IC driver 317 is formed on a silicon substrate 318.

The other components of FIG. 7 may be the same as those of FIG. 3, 4 or 5 and thus are omitted.

The above micro-LED device may be used or included in a display apparatus, as a light source. For example, the display apparatus may include functionalities other than the display.

For example, the display apparatus may be a monochromatic display apparatus. The above micro-LED device may be directly used a light source thereof.

Figure 8:
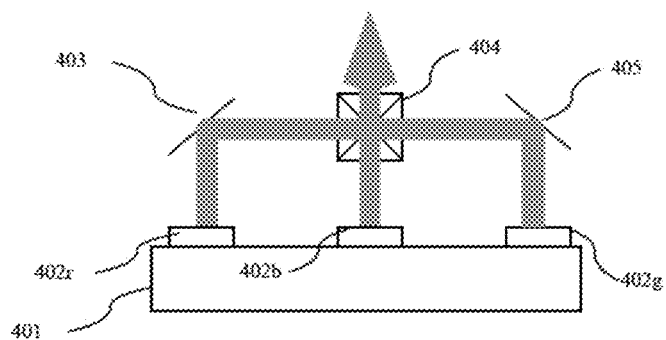
FIG. 8 is schematic diagram of a display apparatus according to another embodiment of the present invention.

Alternatively, the display apparatus can be a full color display apparatus. FIG. 8 shows a schematic diagram of such a display apparatus.

For example, as shown in FIG. 8, the display apparatus includes a red micro-LED device 402r with red micro-LEDs, a green micro-LED device 402g with green micro-LEDs and a blue micro-LED device 402b with blue micro-LEDs as light sub-sources. The micro-LED devices are mounted on a substrate 401. Light from the red, green and blue micro-LED devices 402r, 402g, 402b are combined through an optical system. The optical system may includes mirrors 403, 405 and an optical component 404 which can transmits one of the red, green and blue light and reflects the other color lights. For example, the optical component 404 may include dichroic mirrors.

In the prior art, it is relatively easier to manufacture a red micro-LED device. So, the red micro-LED device may be that of the prior art. At least one of the green micro-LED device and the blue micro-LED device is the micro-LED device as described above.

Figure 9:
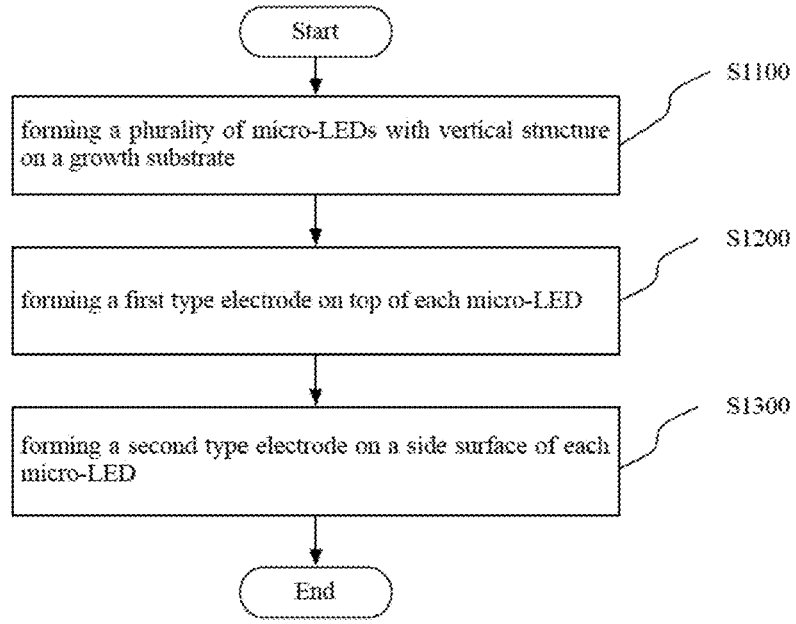
FIG. 9 is schematic diagram of a method for manufacturing a micro-LED device according to another embodiment of the present invention.

FIG. 9 shows schematic diagram of a method for manufacturing a micro-LED device according to another embodiment of the present invention.

As shown in FIG. 9, at step S1100, a plurality of vertical micro-LEDs are formed on a growth substrate.

This step may be the same as that in the prior art. It may include an epitaxy growth, micro-LED patterning on the growth substrate, epitaxy trench etching and so on. The detailed description thereof is omitted.

At step S1200, a first type electrode is formed on top of each micro-LED. Generally, the first type electrode is a P-type electrode, and it may be formed through patterning.

At step S1300, a second type electrode is formed on a side surface of each vertical micro-LED. The second type electrode may be a N-type electrode. For example, it may be formed on bottom side of the vertical micro-LEDs through patterning.

In this method, a side-contact electrode is introduced so that a finished device can be formed using a growth substrate.

The subsequent processes may be similar with those in the prior art. For example, a dielectric layer and a planarization layer may be deposited on the growth substrate and the vertical micro-LEDs. The dielectric layer and the planarization layer may be combined, for example. Then, vias may be formed in the dielectric layer and the planarization layer and be connected to the electrodes. Pads may be formed on top of the planarization layer and be connected with the vias.

Optionally, a control circuitry with TFTs may be built up on top of the vertical micro-LEDs. Alternatively, an IC driver may be bonded to the pads to control and drive the micro-LED device.

Although some specific embodiments of the present invention have been demonstrated in detail with examples, it should be understood by a person skilled in the art that the above examples are only intended to be illustrative but not to limit the scope of the present invention.

What is claimed is:

1. A micro-LED device, comprising:
    a growth substrate;
    a plurality of vertical micro-LEDs formed on the growth substrate, each having a top;
    a first type electrode formed on the top of each of the vertical micro-LEDs; and
    a second type electrode formed on a side surface of each of the vertical micro-LEDs,
    wherein each of the first type electrodes is connected with a first pad through a vertical interconnection via, and the second type electrodes are connected with a second pad through one vertical interconnection via,
    wherein each of the vertical micro-LEDs includes, in sequence above the growth substrate, a second type doped region, a multiple quantum well layer, and a first type doped region the second type doped region including a second type heavily doped region, and the second type electrode covering a side surface of the second type heavily doped region,
    wherein the second type electrode is a conductive layer lower than the multiple quantum well layer, and a planarization layer is formed on the conductive layer.

2. The micro-LED device according to claim I. wherein the plurality of vertical micro-LEDs includes at least one of a green and a blue vertical micro-LEDs, the growth substrate is a sapphire substrate, and the vertical micro-LEDs output light via the growth substrate.

3. The micro-LED device according to claim 1, wherein the first type electrode is a P-type electrode, the second type electrode is a IN-type electrode, the first type doped region is a P-type doped region, and the second type doped region is a N-type doped region.

4. The micro-LED device according to claim 1, wherein a dielectric layer is formed on surface of the vertical micro-LEDs, and the dielectric layer is a Distributed. Bragg Reflector.

5. The micro-LED device according to claim 1, wherein a dielectric layer is formed on the conductive layer.

6. The micro-LED device according to claim 1, wherein a control circuitry is formed above the vertical micro-LEDs.

7. The micro-LED device according to claim 1, wherein the vertical micro-LEDs are bonded to an integrated circuit driver via a conductive bond layer.

8. The micro-LED device according to claim 1, wherein the second type electrodes are deposited between the vertical micro-LEDs and each has a plane with the same height that is higher than the second type heavily doped region and lower than an upper portion of the second type doped region.

9. A display apparatus, including at least one micro-LED device according to claim 1.

10. The display apparatus according to claim 9, further including a red micro-LED device with red micro-LEDs, a green micro-LED device with green micro-LEDs, and a blue micro-LED device with blue micro-LEDs as light sub-sources, and light from the red, green, and blue micro-LED devices are combined through an optical system.

11. A method for manufacturing a micro-LED device, comprising:

forming a plurality of vertical micro-LEDs on a growth. substrate, each having a top;

forming a first type electrode on the top of each of the vertical micro-LED; and forming a second type electrode on a side surface of each of the vertical. micro-LEDs, wherein each of the first type electrodes is connected with a first pad through a vertical interconnection via, and the second type electrodes are connected with a second pad through one vertical interconnection via, wherein each of the vertical micro-LEDs includes, in sequence above the Growth substrate, a second type doped region, a multiple quantum well layer, and a first type doped region, the second type doped region including a second type heavily doped region, and the second type electrode covering a side surface of the second type heavily doped region, wherein the second type electrode is a conductive layer lower than the multiple quantum well layer, and a planarization layer is formed on the conductive layer.

* * * * *